United States Patent [19]
Vampola et al.

[11] Patent Number: 6,121,843
[45] Date of Patent: Sep. 19, 2000

[54] CHARGE MODE CAPACITOR TRANSIMPEDANCE AMPLIFIER

[75] Inventors: John L. Vampola; Mary J. Hewitt, both of Santa Barbara, Calif.

[73] Assignee: Raytheon Company, Lexington, Mass.

[21] Appl. No.: 09/326,080

[22] Filed: Jun. 4, 1999

[51] Int. Cl.[7] ....................................................... H03F 3/08
[52] U.S. Cl. ........................................ 330/308; 250/214 A
[58] Field of Search .............................. 250/214 A; 330/9, 330/110, 292, 308

[56] References Cited

U.S. PATENT DOCUMENTS

| | | | |
|---|---|---|---|
| 4,786,831 | 11/1988 | Morse et al. | 307/490 |
| 4,956,716 | 9/1990 | Hewitt et al. | 358/213.27 |
| 4,978,872 | 12/1990 | Morse et al. | 307/490 |
| 5,043,820 | 8/1991 | Wyles et al. | 358/213.28 |
| 5,322,995 | 6/1994 | Ohkanwa et al. | 250/214 A |
| 5,347,231 | 9/1994 | Bertuccio et al. | 330/308 X |
| 5,602,511 | 2/1997 | Woolaway | 330/282 |
| 5,990,745 | 11/1999 | Carroll | 330/308 X |

*Primary Examiner*—Steven J. Mottola
*Attorney, Agent, or Firm*—William C. Schubert; Glenn H. Lenzen, Jr.

[57] ABSTRACT

An amplifier circuit, referred to as a charge mode capacitor transimpedance amplifier (or CM-CTIA) an input node (IN) and an output node (OUT), and includes a transistor ($M_{IN}$) having a gate terminal (G) coupled to the input node, a source terminal (S), and a drain terminal (D) coupled to the output node, a first capacitance ($C_{FB}$) coupled between the gate terminal and the drain terminal, a second capacitance ($C_S$) coupled between the source terminal and a first potential (GND), a third capacitance ($C_D$) coupled between the drain terminal and the first potential or another fixed potential, a first switch (SW1) coupled between a second potential and the drain terminal, and a second switch (SW2) coupled between a third potential ($V_{RESET}$) and the gate terminal. During use, the input node is coupled to an output of a radiation detector, such as a photovoltaic IR detector (12) that forms one element or pixel of an array of IR detectors. An open loop gain of the amplifier circuit is established by a ratio of the value of the second capacitance to the value of the third capacitance, and a transimpedance of the amplifier circuit is established by the value of the first capacitance, the value of the second capacitance, and the value of the third capacitance.

7 Claims, 2 Drawing Sheets

6,121,843

CHARGE MODE CAPACITOR TRANSIMPEDANCE AMPLIFIER

FIELD OF THE INVENTION

This invention relates generally to amplifier circuitry for use with detectors of electromagnetic radiation and, in particular, to capacitive transimpedance amplifiers of a type used in readout integrated circuits (ROICs) that are electrically connected to or integrated with a focal plane array (FPA), such as a staring type of FPA, that contains solid state detectors of infrared (IR) radiation.

BACKGROUND OF THE INVENTION

The CTIA (Capacitor Transimpedance Amplifier) is utilized in infrared and other sensing applications to integrate the current generated from a radiation detector for a specified period of time, referred to as the integration time. Referring to FIG. 1A, the CTIA of a particular unit cell contains a high gain inverting amplifier or driver with a capacitor in the feedback loop ($C_{FB}$). The inverting amplifier typically contains, as a minimum, two active transistors or MOSFETs (metal oxide semiconductor field effect transistors). A first transistor or MOSFET is used to provide a constant current source (typically referred to as the load), while the second transistor or MOSFET is used to implement the driver itself. A reset switch is placed across the feedback capacitor and is closed to discharge the capacitor and is then opened to begin the integration time. The output voltage of the CTIA is proportional to the product of the detector current ($I_D$) and the integration time, and is inversely proportional to the value of the feedback capacitor $C_{FB}$. The input voltage is maintained near the reset value by the feedback loop, which maintains a nearly constant bias on the radiation detector. At the end of the integration time the output voltage is sampled by momentarily closing an output multiplexer (MUX) switch, the reset switch is closed, and the CTIA is ready for the next integration.

In a conventional implementation, a two dimensional array of detectors and unit cells are arranged in a row and column (x by y) matrix (only one unit cell of one column is depicted in FIG. 1A). Typically the MUX switch of the unit cells are closed and then opened one after another to readout in sequence the x unit cell outputs from each of the rows connected to a single one of the y column output lines. Also connected to the column line may be an input of a sample and hold (S/H) circuit (not shown), followed by a voltage follower (not shown). The output voltages may eventually be converted to a digital form and then operated on by a data processing system for performing any desired image processing, or to simply store the image(s) for subsequent transmission to another location.

The CTIA has been found to be one of the circuits best suited for the low noise amplification of signals from infrared detectors. However, the conventional CTIA requires a constant current to keep it active throughout the signal integration cycle, and also requires a significant amount of circuit layout area to accommodate all of the circuitry normally associated with its implementation. The constant current requirement results in constant power dissipation, which in turn can place a considerable load on the (cryogenic) cooling system that is normally required when operating high performance IR detectors. Furthermore, the significant power dissipation, in combination with the significant circuit area required to layout the CTIA, tends to restrict the number of unit cells that it is practical to place within a given chip. As such, the number of detector sites is limited, as is the minimum spacing between detector sites, resulting directly in a limit on the achievable image resolution.

Also, it is known in the art to perform a correlated double sampling of the detector output signal, wherein the detector output at the beginning of an integration period is clamped or stored, and is subtracted from the integrated charge during the integration period. A resulting difference signal is what is sampled and readout at the end of the integration period. However, in conventional practice the provision of correlated double sampling in the unit cell requires the addition of large analog transistors, thereby further increasing power consumption and the required unit cell circuit area.

Reference with regard to various aspects of charge amplifiers and CTIAs may be had to the following U.S. Patents, namely U.S. Pat. No. 4,956,716, "Imaging System Employing Charge Amplifier", by Hewitt et al.; U.S. Pat. No. 5,043,820, "Focal Plane Array Readout Employing One Capacitive Feedback Transimpedance Amplifier For Each Column", by Wyles et al.; U.S. Pat. No. 5,602,511, "Capacitive Transimpedance Amplifier Having Dynamic Compression", by Woolaway; and U.S. Pat. Nos. 4,978,872 and 4,786,831, both entitled "Integrating Capacitively Coupled Transimpedance Amplifier", by Morse et al. The disclosures of these U.S. Patents are incorporated by reference herein in their entireties.

Of particular interest is the two stage amplifier illustrated in FIG. 4 of U.S. Pat. No. 4,956,716, by Hewitt et al., a portion of which (the first stage) is depicted herein in FIG. 1B. The first stage includes two N-channel MOSFETs (each having a gate (G), source (S) and a drain (D)) which are powered by electric energy stored in two capacitors C1 and 3C1. The designation '3C1' indicates that the capacitance value of this capacitor is three times that of C1. The ratio of these capacitances (i.e., 3) determines the voltage gain of the first stage. The second stage is implemented in a similar fashion.

However, this particular charge amplifier, while being well suited for its intended application(s), is not a CTIA, and does not include, for example, the feedback capacitance ($C_{FB}$) loop as depicted in FIG. 1A.

OBJECTS AND ADVANTAGES OF THE INVENTION

It is a first object and advantage of this invention to provide an improved radiation detector amplifier circuit that requires less operating power and a smaller layout area than conventional CTIAs.

It is a further object and advantage of this invention to provide an improved CTIA that contains a plurality of capacitances, and that relies on these capacitances to derive its operating current and to establish its gain.

SUMMARY OF THE INVENTION

The foregoing and other problems are overcome and the objects and advantages are realized by methods and apparatus in accordance with embodiments of this invention, wherein an improved amplifier circuit, referred to herein for convenience as a charge mode CTIA, or simply as a CM-CTIA, utilizes capacitors and a transistor, such as a MOSFET, to form a high gain amplifier that relies on charge storage to derive its source of current and gain. The CM-CTIA avoids the high power required to bias a conventional CTIA. Additionally, and in that correlated double sampling can be performed without the additional large analog transistors which are normally required, the CM-CTIA fits within a smaller circuit area or 'footprint' than many conventional CTIA designs.

This invention thus teaches an amplifier circuit that has an input node and an output node, and which includes a transistor having a gate terminal coupled to the input node, a source terminal, and a drain terminal coupled to the output node, a first capacitance coupled between the gate terminal and the drain terminal, a second capacitance coupled between the source terminal and a first potential, a third capacitance coupled between the drain terminal and the first potential or another fixed potential, a first switch coupled between a second potential and the drain terminal, and a second switch coupled between a third potential and the gate terminal.

During use, the input node is preferably coupled to an output of a radiation detector, such as a photovoltaic IR detector that forms one element or pixel of an array of IR detectors. The amplifier circuit may be located on a separate chip that is coupled to or hybridized with the IR detector array chip, or the IR detectors and the amplifier circuits may be fabricated on the same chip.

An open loop gain of the amplifier circuit is established by a ratio of the value of the second capacitance to the value of the third capacitance, and a transimpedance of the amplifier circuit is established by the value of the first capacitance, the value of the second capacitance, and the value of the third capacitance.

The amplifier circuit is reset during use by closing the first switch to connect the drain terminal to the second potential, closing the second switch to connect the gate terminal to the third potential, changing the value of the second potential to the value of the first potential and then changing it back to the value of the second potential, opening the second switch, and then opening the first switch. Opening the first switch after opening the second switch has the effect of storing an initial integration voltage on the second capacitance, which in effect performs a clamp function of a type that is typically performed when using correlated double sampling techniques.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1A:
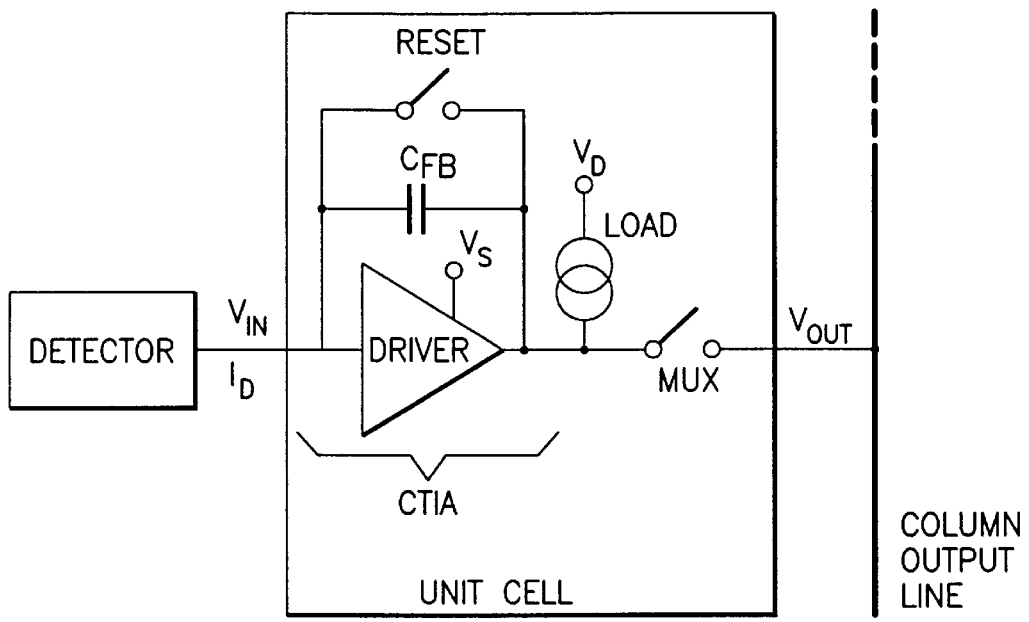
FIG. 1A is a simplified diagram of a unit cell containing a conventional CTIA.
Figure 1B:
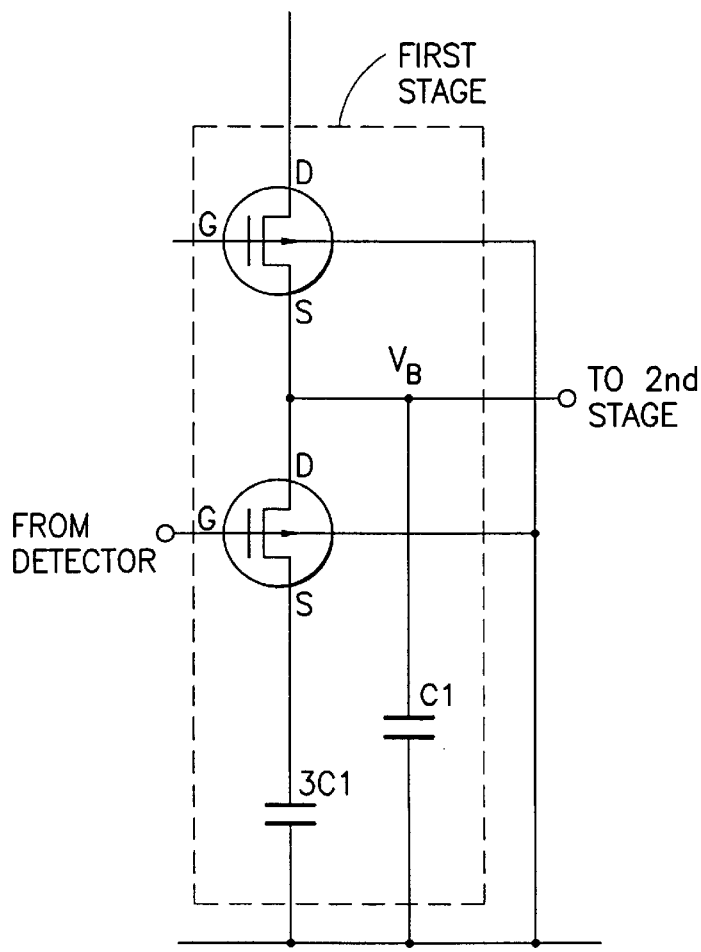
FIG. 1B is a portion of a schematic diagram of a prior art charge amplifier.
Figure 2:
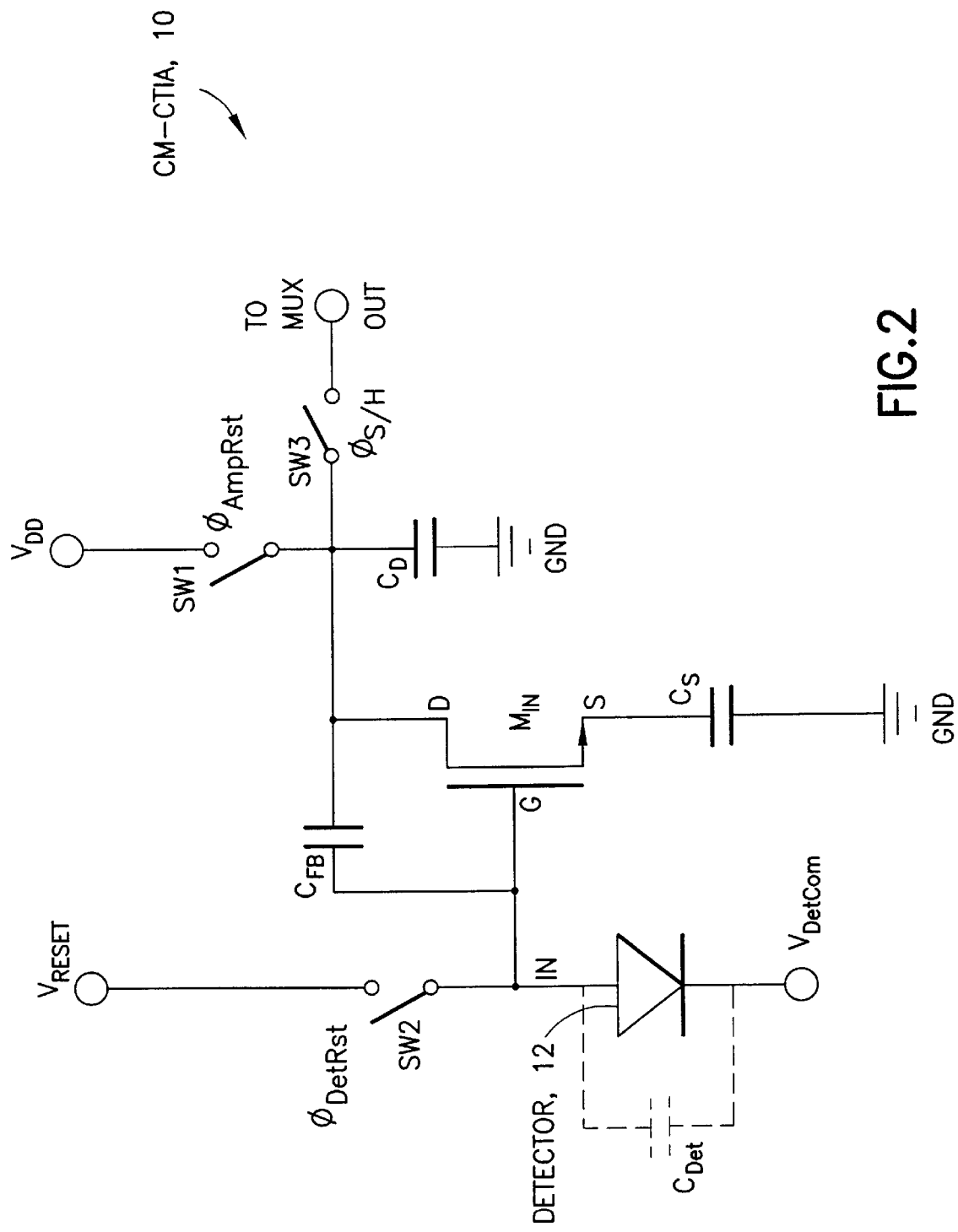
FIG. 2 is a schematic diagram of a CM-CTIA in accordance with the teaching of this invention.

Referring to FIG. 2, the CM-CTIA 10 has an input node (IN) for connection to an output of a radiation detector 12 (shown as a photovoltaic diode) which is also connected to a detector common potential ($V_{DETCOM}$). A capacitance ($C_{det}$) is assumed to be associated with the detector 12, and represents the junction capacitance as well as any stray or parasitic capacitances. The CM-CTIA 10 also has an output node (OUT) that is typically connected to an output multiplexer or to another amplifier, and that is switchably coupled to the drain of the MOSFET through a switch SW3 that is operated by a timing (control) waveform $\phi_{S/H}$, where S/H refers to 'sample and hold'.

The CM-CTIA 10 in this embodiment of the invention contains but a single N-channel MOSFET ($M_{IN}$) and two capacitors, $C_S$ and $C_D$, which together provide inverting gain from the MOSFET gate (G) to drain (D). $C_S$ is connected between the source terminal (S) of the MOSFET to a common potential (shown as circuit ground (GND)), and $C_D$ is connected between the drain terminal (D) of the MOSFET and the common potential (or another fixed potential). Gain is accomplished by ratioing the two capacitors, $C_S$ and $C_D$, such that the capacitor connected to the MOSFET source (S), or $C_S$, is significantly larger than the capacitor connected to the drain, or $C_D$. The source of the MOSFET "follows" the voltage on the gate, minus the MOSFET threshold voltage, and thus charges up the source capacitor $C_S$. The required charge is furnished from the drain capacitor, $C_D$, which because it is smaller than the source capacitor $C_S$, discharges faster than $C_S$ charges. In this arrangement the 'open loop' inverting gain is approximately equal to the ratio of the source to drain capacitors, i.e., $C_S/C_D$, which could be set to three or to any desired practical value.

The addition of the feedback capacitor, $C_{FB}$, completes the basic CM-CTIA 10. The feedback capacitor $C_{FB}$ is connected between the gate terminal (G) and the drain terminal (D) of the MOSFET. As the output node (OUT) is discharged, the feedback capacitor $C_{FB}$ tends to reduce the detector voltage at the input node (IN) in a manner similar to a conventional CTIA. However, and unlike the conventional CTIA, the transimpedance of the CM-CTIA 10 is determined not only by the feedback capacitor $C_{FB}$, but also by the source and drain capacitors, $C_S$ and $C_D$.

The change in the output voltage at the MOSFET drain can be sampled and held in the unit cell, or it can be multiplexed to a downstream amplifier.

The CM-CTIA 10 is reset by closing an amplifier reset switch (SW1), using timing (control) signal $\phi_{AmpRst}$, to connect the drain of the MOSFET to a potential $V_{DD}$, and closing a detector reset switch (SW2), using timing (control) signal $\phi_{DetRst}$, to connect the gate of the MOSFET, and the anode of the detector 12, to a potential $V_{RESET}$. SW1 and SW2 may be closed at the same time. A next step clocks $V_{DD}$ to zero (i.e., to the value of the potential to which one plate of $C_S$ is connected) and then back to its normal value. This switching action serves to reset the source capacitor $C_S$ through what is known in the charge coupled device art as a "tompset" technique. The detector reset switch SW2 is then released (opened), followed by the amplifier reset switch SW1. In that the amplifier reset switch SW1 is released last, the CM-CTIAs stores the initial integration voltage on the source capacitor $C_S$, in effect performing the initial clamp function utilized in correlated double sampling. At the end of the integration period SW3 is closed to read out the resulting signal, and then opened again. As is typically the case, the switches SW1, SW2 and SW2 may be implemented with transistors, such as MOSFETs, that are turned on and off using their respective timing (control) signals, or by any devices suitable for connecting two circuit nodes together through a low impedance path.

Suitable values for $V_{RESET}$ and $V_{DD}$, relative to circuit ground, are approximately +1.5 volts and +5 volts, respectively. A suitable value for $V_{DETCOM}$, relative to circuit ground, is also approximately +1.5 volts.

Note that since SW1 is opened prior to the integration period beginning, the current required to operate the MOSFET is being provided by the charge stored on $C_D$, resulting in a reduced power, lower noise operation.

The CM-CTIA 10, in accordance with the teachings of this invention, enables a low power implementation to be achieved for use in, for example, large staring-type FPAs. In that the required operating power is significantly reduced, the cryogenic cooling margin is enhanced. This in turn enables greater numbers of the low noise CM-CTIAs to be used within a given sensor chip assembly. Furthermore, and since the implementation of the CM-CTIA in a silicon integrated circuit requires significantly less area than a conventional CTIA, the density of the unit cells can be increased significantly.

The use of the CM-CTIA 10 is especially advantageous in those applications having cooling limitations, such as space-based applications. Furthermore, and since the CM-CTIA 10 is self-bandlimiting, and is therefore inherently quieter than other radiation detector amplifier circuits, its use is beneficial in laser and astronomical applications as well. In further detail, the impedance of the MOSFET Source ($1/g_m$) is very high at the low current levels used by this circuit, and the band limiting is provided by the resistor-capacitor (RC) circuit comprised of the MOSFET Source and the capacitor Cs.

Although described in the context of an N-channel MOSFET embodiment, those skilled in the art would realize that a P-channel implementation could be provided as well, as could implementations based on other types of transistors. Furthermore, those skilled in the art would realize that if the transistor were implemented with a bipolar device, then the gate, source and drain terminals would be replaced by base, emitter and collector terminals.

Also, those skilled in the art should appreciate that the additional circuitry can be inserted prior to SW3 to provide additional gain and/or some desired waveform processing prior to multiplexing.

Thus, while the invention has been particularly shown and described with respect to preferred embodiments thereof, it will be understood by those skilled in the art that changes in form and details may be made therein without departing from the scope and spirit of the invention.

What is claimed is:

1. An amplifier circuit having an input node and an output node, comprising:
    a transistor having a gate terminal coupled to said input node, a source terminal, and a drain terminal coupled to said output node;
    a first capacitance coupled between said gate terminal and said drain terminal;
    a second capacitance coupled between said source terminal and a first potential;
    a third capacitance coupled between said drain terminal and said first potential or another fixed potential;
    a first switch coupled between a second potential and said drain terminal; and
    a second switch coupled between a third potential and said gate terminal; wherein
    an open loop gain of said amplifier circuit is established by a ratio of the value of said second capacitance to the value of said third capacitance; and
    wherein a transimpedance of said amplifier circuit is established by the value of said first capacitance, the value of said second capacitance, and the value of said third capacitance.

2. An amplifier circuit as set forth in claim 1, wherein said input node is coupled to an output of a radiation detector.

3. An amplifier circuit as in claim 1, wherein said amplifier circuit is reset by closing said first switch to connect said drain terminal to said second potential, closing said second switch to connect said gate terminal to said third potential, changing the value of said second potential to the value of said first potential and then changing it back to the value of said second potential, opening the second switch, and then opening the first switch.

4. An amplifier circuit as in claim 3, wherein opening the first switch after opening the second switch results in storing an initial integration voltage on the second capacitance.

5. A method for operating an amplifier circuit having an input node coupled to an output of a radiation detector and an output node coupled to a multiplexer for being periodically sampled, comprising steps of:
    providing the amplifier circuit so as to comprise a transistor having a gate terminal coupled to said input node, a source terminal, and a drain terminal coupled to said output node, a first capacitance coupled between said gate terminal and said drain terminal, a second capacitance coupled between said source terminal and a first potential, a third capacitance coupled between said drain terminal and said first potential or another fixed potential, a first switch coupled between a second potential and said drain terminal, and a second switch coupled between a third potential and said gate terminal; and
    resetting said amplifier circuit by steps of,
    closing said first switch to connect said drain terminal to said second potential;
    closing said second switch to connect said gate terminal to said third potential;
    changing the value of said second potential to the value of said first potential, and then changing it back to the value of said second potential;
    opening said second switch; and
    opening said first switch.

6. A method as in claim 5, wherein the step of opening first switch is performed after the step of opening the second switch, and includes a step of storing an initial integration voltage on said second capacitance.

7. A method as in claim 5, wherein the step of providing establishes an open loop gain of said amplifier circuit by a ratio of the value of said second capacitance to the value of said third capacitance, and further establishes a transimpedance of said amplifier circuit by the value of said first capacitance, the value of said second capacitance, and the value of said third capacitance.

* * * * *